(12) United States Patent
Lee et al.

(10) Patent No.: US 12,298,676 B2
(45) Date of Patent: May 13, 2025

(54) SUBSTRATE PROCESSING APPARATUS

(71) Applicant: Samsung Electronics Co., Ltd., Suwon-si (KR)

(72) Inventors: Injae Lee, Suwon-si (KR); Sungyong Bae, Suwon-si (KR); Daegeun Yoon, Suwon-si (KR); Inho Choi, Suwon-si (KR); Sunghyup Kim, Suwon-si (KR); Euishin Kim, Suwon-si (KR); Jeonggil Kim, Suwon-si (KR); Yebin Nam, Suwon-si (KR); Dongjin Lee, Suwon-si (KR); Jonggu Lee, Suwon-si (KR); Dohyun Jung, Suwon-si (KR); Dongsik Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 18/322,161

(22) Filed: May 23, 2023

(65) Prior Publication Data
US 2024/0142886 A1    May 2, 2024

(30) Foreign Application Priority Data
Oct. 26, 2022 (KR) ........................ 10-2022-0138928

(51) Int. Cl.
*G03F 7/00* (2006.01)
*H01L 21/68* (2006.01)

(52) U.S. Cl.
CPC ...... *G03F 7/70908* (2013.01); *G03F 7/70716* (2013.01); *H01L 21/68* (2013.01)

(58) Field of Classification Search
CPC . H01L 21/68; G03F 7/70716; G03F 7/70908; G03F 7/70916; G03F 7/70925
See application file for complete search history.

(56) References Cited

U.S. PATENT DOCUMENTS

| | | | |
|---|---|---|---|
| 8,797,508 B2 * | 8/2014 | Shibazaki | ........... G03F 7/70775 355/72 |
| 9,958,792 B2 | 5/2018 | Shibazaki | |
| 9,983,486 B2 | 5/2018 | Shibazaki | |
| 10,338,482 B2 | 7/2019 | Shibazaki | |

(Continued)

FOREIGN PATENT DOCUMENTS

| | | |
|---|---|---|
| KR | 20150097715 A | 8/2015 |
| KR | 101933360 B1 | 12/2018 |

*Primary Examiner* — Deoram Persaud
(74) *Attorney, Agent, or Firm* — Myers Bigel, P.A.

(57) ABSTRACT

A substrate processing apparatus includes a table in an exposure chamber that is configured to perform an exposure process on a semiconductor substrate, a guiding device including a first horizontal driving body slidably movable in a first horizontal direction and a guide rail on the first horizontal driving body and having a trench extending in a second horizontal direction, a positioning device connected to the guiding device, the positioning device including a slider, a second horizontal driving body and a substrate stage, the slider configured to slidably move in the second horizontal direction along the trench, the second horizontal driving body connected or fixed to the slider, the substrate stage on the second horizontal driving body and configured to support the semiconductor substrate, and a blocking member between the guide rail and the substrate stage to block an inflow of foreign substances onto the substrate stage.

20 Claims, 7 Drawing Sheets

(56) References Cited

U.S. PATENT DOCUMENTS

| | | | |
|---|---|---|---|
| 10,353,301 B2 | 7/2019 | Shibazaki | |
| 10,353,302 B2 | 7/2019 | Shibazaki | |
| 10,649,348 B2 * | 5/2020 | Aoki | G03F 7/70758 |
| 10,678,146 B2 | 6/2020 | Wu et al. | |
| 11,150,564 B1 | 10/2021 | Chen et al. | |
| 11,204,558 B2 | 12/2021 | Huang et al. | |
| 2001/0013927 A1 * | 8/2001 | Itoh | G03F 7/70758 |
| | | | 355/53 |
| 2007/0211235 A1 * | 9/2007 | Shibazaki | G03F 7/70341 |
| | | | 355/72 |
| 2008/0094592 A1 | 4/2008 | Shibazaki | |
| 2010/0045961 A1 * | 2/2010 | Li | G03F 7/70733 |
| | | | 355/73 |
| 2015/0331338 A1 | 11/2015 | Arlemark et al. | |
| 2021/0397102 A1 | 12/2021 | Chen et al. | |
| 2022/0066331 A1 | 3/2022 | Wang et al. | |
| 2022/0084781 A1 | 3/2022 | Van Gerven et al. | |
| 2024/0092094 A1 * | 3/2024 | Jung | B41J 11/0015 |

* cited by examiner

SUBSTRATE PROCESSING APPARATUS

PRIORITY STATEMENT

This application claims priority under 35 U.S.C. § 119 to Korean Patent Application No. 10-2022-0138928, filed on Oct. 26, 2022 in the Korean Intellectual Property Office (KIPO), the contents of which are herein incorporated by reference in their entirety.

BACKGROUND

Example embodiments relate to a substrate processing apparatus. More particularly, example embodiments relate to a substrate processing apparatus configured to perform an exposure process on a semiconductor substrate.

A plurality of positioning devices may move a semiconductor substrate in order to perform photolithography on the semiconductor substrate. A slider fixedly provided on the positioning device may move in a horizontal direction along a guide rail, and particles may be generated from a damper provided on the slider. In addition, foreign substances generated from the surroundings of the semiconductor substrate may flow and remain in a trench of the guide rail. The foreign substances may remain in the trench of the guide rail that has an upper open surface. The foreign substances may be introduced onto the semiconductor substrate on the positioning device by airflow that is generated while the positioning device moves along the guide rail, thereby resulting in defects on the semiconductor substrate due to the introduced foreign substances.

SUMMARY

Example embodiments provide a substrate processing apparatus including a blocking member capable of blocking an inflow of foreign substances that are generated during a movement of a positioning device.

According to example embodiments, a substrate processing apparatus includes a table in an exposure chamber that is configured to perform an exposure process on a semiconductor substrate, a guiding device including a first horizontal driving body slidably movable in a first horizontal direction on the table and a guide rail on the first horizontal driving body and having a trench extending in a second horizontal direction perpendicular to the first horizontal direction, a positioning device connected to the guiding device to be movable together with the guiding device, the positioning device including a slider, a second horizontal driving body and a substrate stage, the slider configured to slidably move in the second horizontal direction along the trench of the guide rail, the second horizontal driving body connected or fixed to the slider to be movable together with the slider, the substrate stage on the second horizontal driving body and configured to support the semiconductor substrate, and a blocking member between the guide rail and the substrate stage to block an inflow of foreign substances onto the substrate stage, the blocking member including a vertical blocking plate and a horizontal blocking plate, the vertical blocking plate extending in a vertical direction at one side of the substrate stage to cover a side wall of the substrate stage, the horizontal blocking plate extending in the second horizontal direction from the one side of the substrate stage to vertically overlap the trench of the guide rail.

According to example embodiments, a substrate processing apparatus includes a table in an exposure chamber that is configured to perform an exposure process on a semiconductor substrate, a guiding device including a first horizontal driving body slidably movable in a first horizontal direction along an outside edge of the table and a guide rail at one side of the first horizontal driving body and extending on the table in a second horizontal direction perpendicular to the first horizontal direction, the guide rail having a trench therein and extending in the second horizontal direction, a positioning device including a slider, a second horizontal driving body and a substrate stage, the substrate stage configured to support the semiconductor substrate, the second horizontal driving body configured to transfer the substrate stage on the table, the slider fixed to the substrate stage to slidably move in the second horizontal direction within the trench and to limit rotation of the substrate stage, and a blocking member between the guide rail and the substrate stage to block an inflow of foreign substances onto the substrate stage, the blocking member detachably connected to the substrate stage, the blocking member including a vertical blocking plate and a horizontal blocking plate, the vertical blocking plate extending in a vertical direction, the horizontal blocking plate extending in the first horizontal direction to vertically overlap at least a portion of the guide rail.

According to example embodiments, a substrate processing apparatus includes a table on which an exposure process is performed on a semiconductor substrate, a guiding device including a first horizontal driving body and a guide rail, the first horizontal driving body slidably movable in a first horizontal direction along an edge of the table, the guide rail extending on the table in a second horizontal direction perpendicular to the first horizontal direction, and a positioning device configured to transport the semiconductor substrate on the table. The positioning device includes a substrate stage on which the semiconductor substrate is configured to be mounted, a second horizontal driving body configured to transport the substrate stage on the table using magnetic levitation, a slider connected or fixed to the substrate stage to be slidable in the second horizontal direction on the guide rail and to limit rotation of the substrate stage, and a blocking member configured to be connected to and disconnected from the substrate stage, the blocking member configured to block an inflow of foreign substances from the guide rail, the blocking member including a vertical blocking plate and a horizontal blocking plate, the vertical blocking plate extending in a vertical direction from the substrate stage, the horizontal blocking plate extending away from the substrate stage in the first horizontal direction to be spaced apart from an upper surface of the guide rail and to vertically overlap at least a portion of the guide rail.

According to example embodiments, a substrate processing apparatus may include a table provided in an exposure chamber that is configured to perform an exposure process on a semiconductor substrate, a guiding device including guide rail that has a first horizontal driving body and a trench, the first horizontal driving body being slidable in a first horizontal direction on the table, the trench provided on one side of the first horizontal driving body, the trench extending in a second horizontal direction perpendicular to the first horizontal direction, a positioning device combined to be movable together with the guiding device, the positioning device including a slider, a second horizontal driving body and a substrate stage, the slider being slidable in the second horizontal direction along the trench of the guide rail, the second horizontal driving body fixed to the slider and being movable together with the slider, the substrate stage fixed on the second horizontal driving body and configured to support the semiconductor substrate, and a blocking member provided between the guide rail and the substrate stage to block an inflow of foreign substances onto the substrate stage, the blocking member including a vertical blocking plate and a horizontal blocking plate, the vertical blocking plate extending in a vertical direction from one side of the substrate stage to cover one side wall of the substrate stage, the horizontal blocking plate extending in the second horizontal direction from the one side of the substrate stage to cover the trench of the guide rail.

Thus, the vertical blocking plate may block foreign substances included in a flow that is generated while the positioning device moves in the first horizontal direction. Since the horizontal blocking plate is spaced apart and covers the guide rail, the horizontal blocking plate may block the release of the foreign substances that remains in the trench of the guide rail, and the horizontal blocking plate may block the foreign substances that could otherwise flow into the guide rail.

Since the trench of the guide rail has a structure suitable for retaining the foreign substances, a large amount of the foreign substances may remain inside the trench. The horizontal blocking plate may prevent the foreign substances from being discharged from the trench. Since the horizontal blocking plate blocks the flow into the trench of the guide rail, generation of the foreign substances during the process may be reduced. Since the flow of the foreign substances into the semiconductor substrate is blocked, defects occurring on the semiconductor substrate may be reduced.

Also, since the vertical blocking plate and the horizontal blocking plate may be combined with and separated from the positioning device, cleaning and maintenance may be facilitated.

BRIEF DESCRIPTION OF THE DRAWINGS

Example embodiments will be more clearly understood from the following detailed description taken in conjunction with the accompanying drawings. FIGS. 1 to 8 represent non-limiting, example embodiments as described herein.

DETAILED DESCRIPTION

Hereinafter, example embodiments will be explained in detail with reference to the accompanying drawings.

Figure 1:
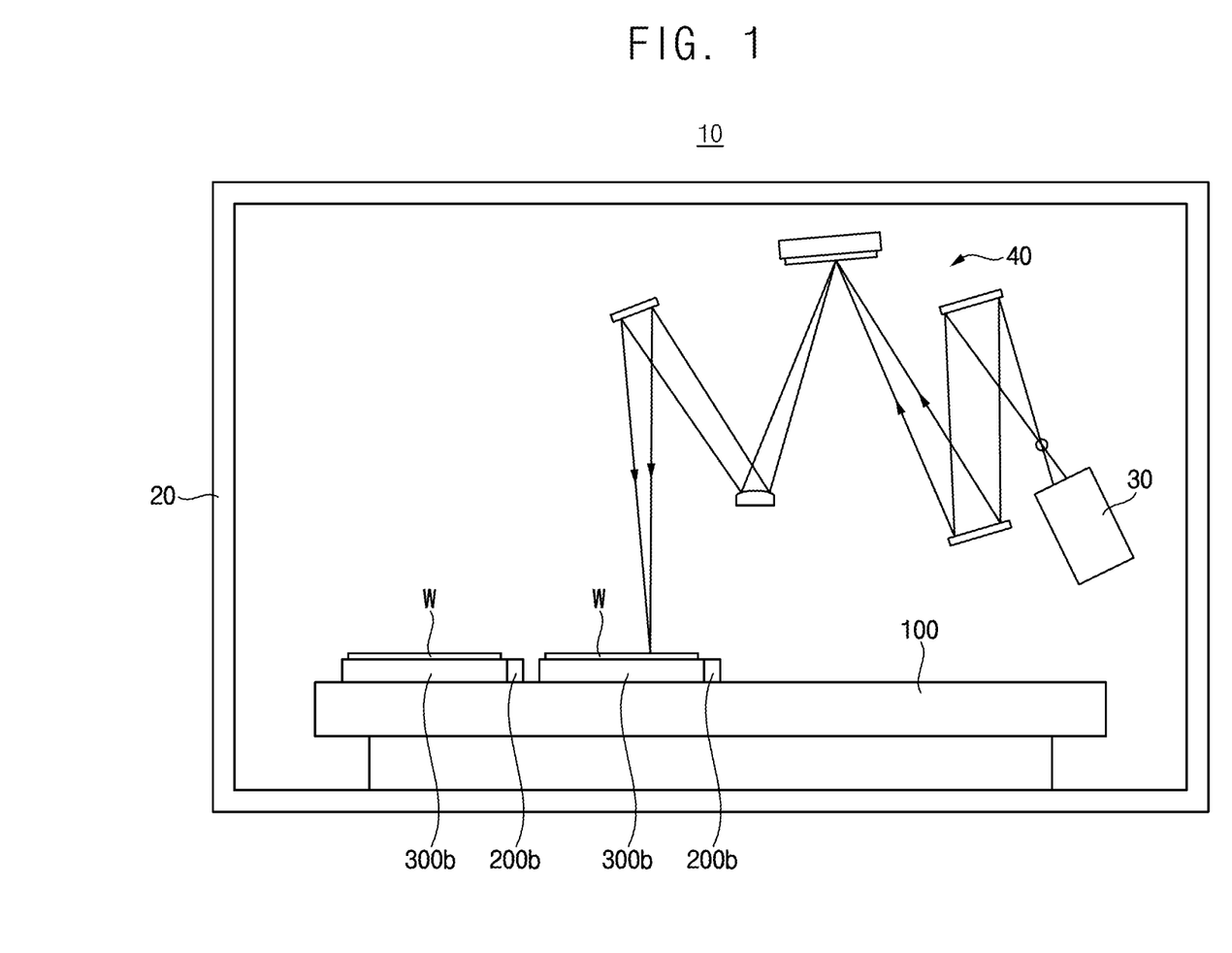
FIG. 1 is a view illustrating a substrate processing apparatus in accordance with example embodiments.
Figure 2:
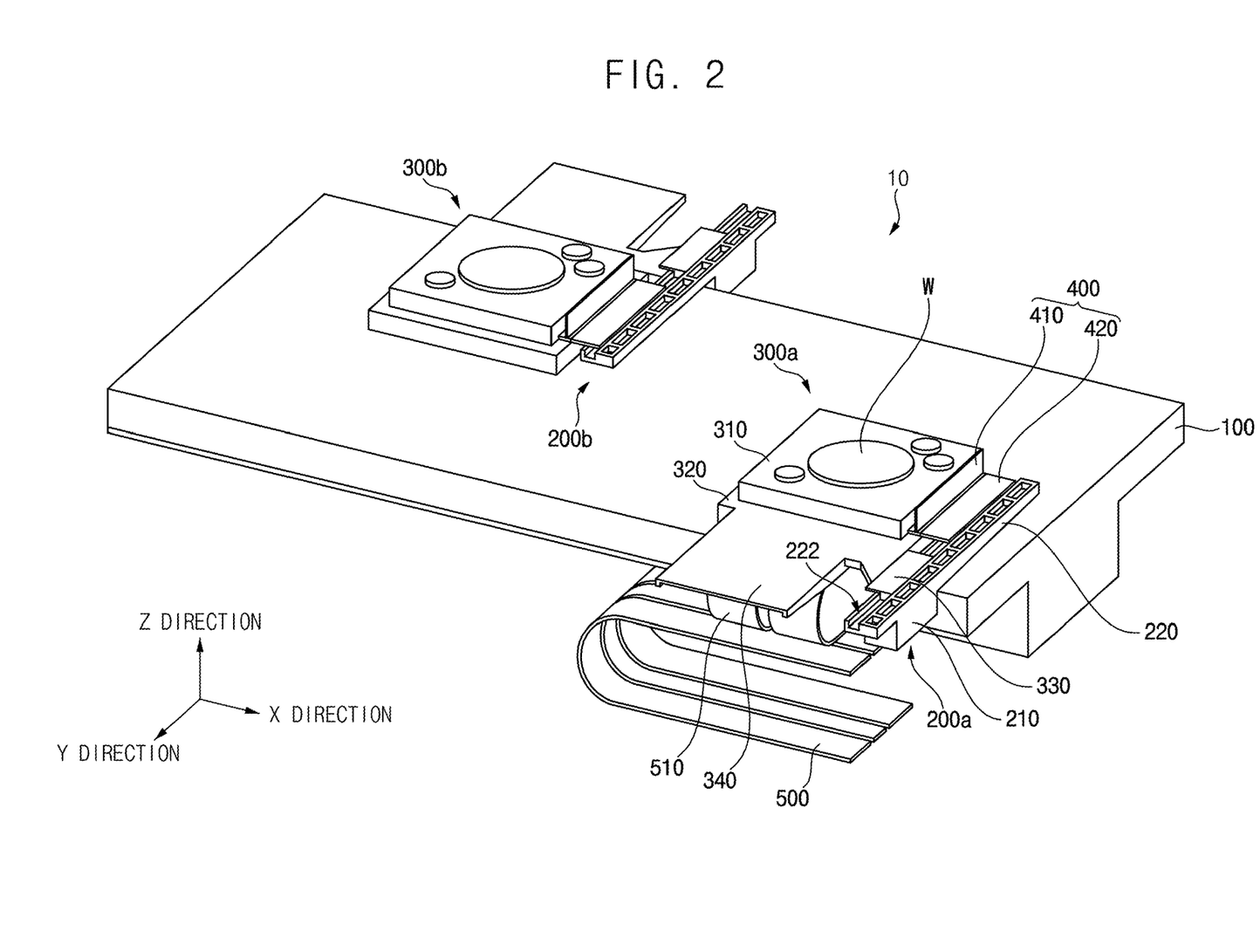
FIG. 2 is a view illustrating a positioning device and guiding device that are movable on a table.
Figure 3:
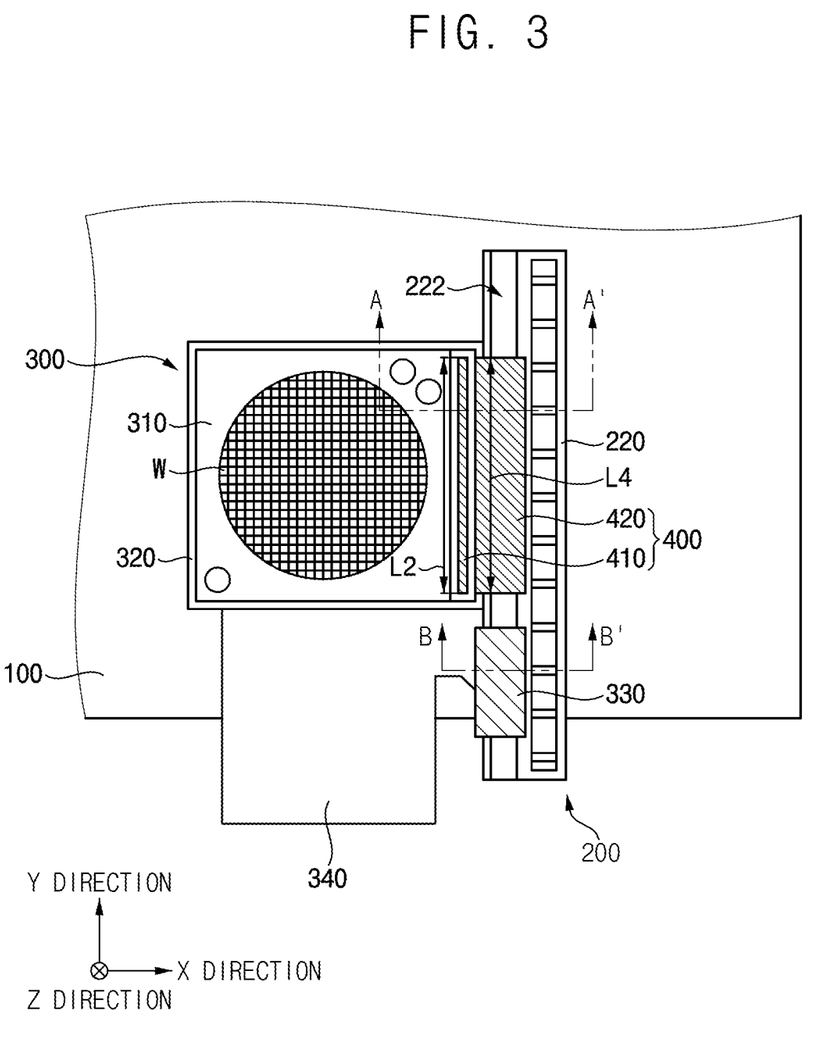
FIG. 3 is a plan view illustrating the positioning device and the guiding device in FIG. 2.
Figure 4:
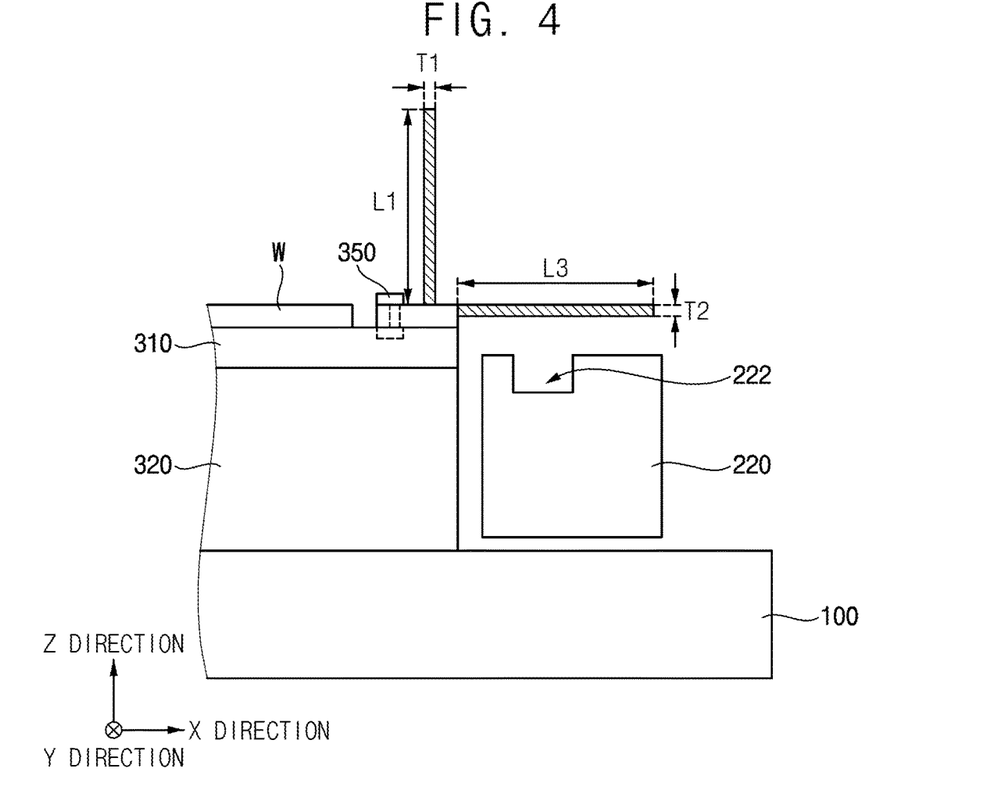
FIG. 4 is cross-sectional views taken along the line A-A' in FIG. 3.
Figure 5:
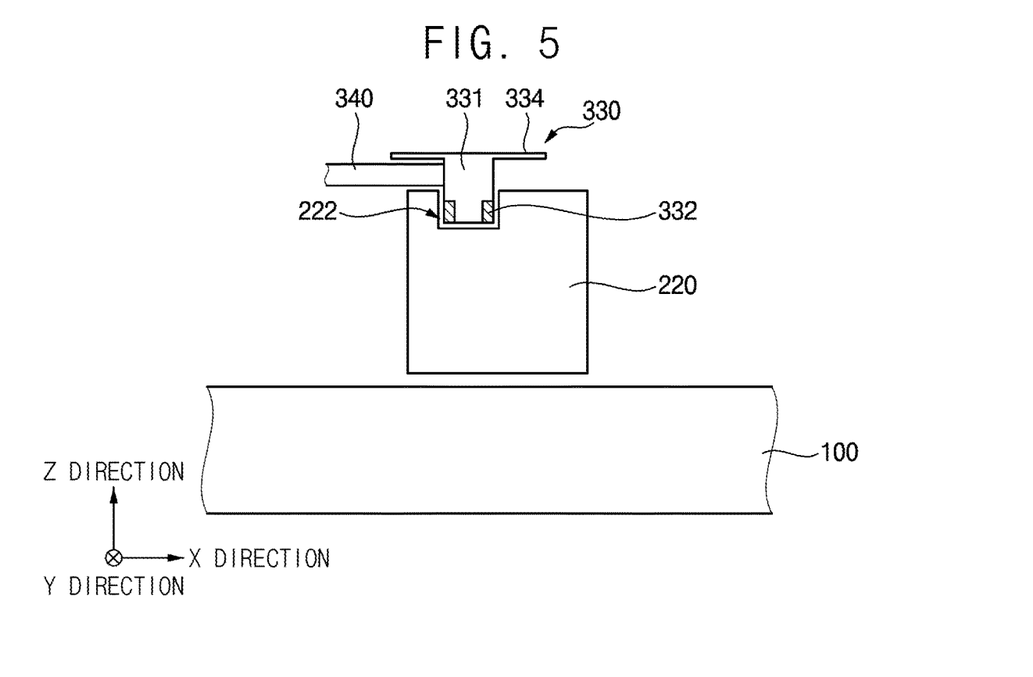
FIG. 5 is cross-sectional views taken along the line B-B' in FIG. 3.
Figure 6:
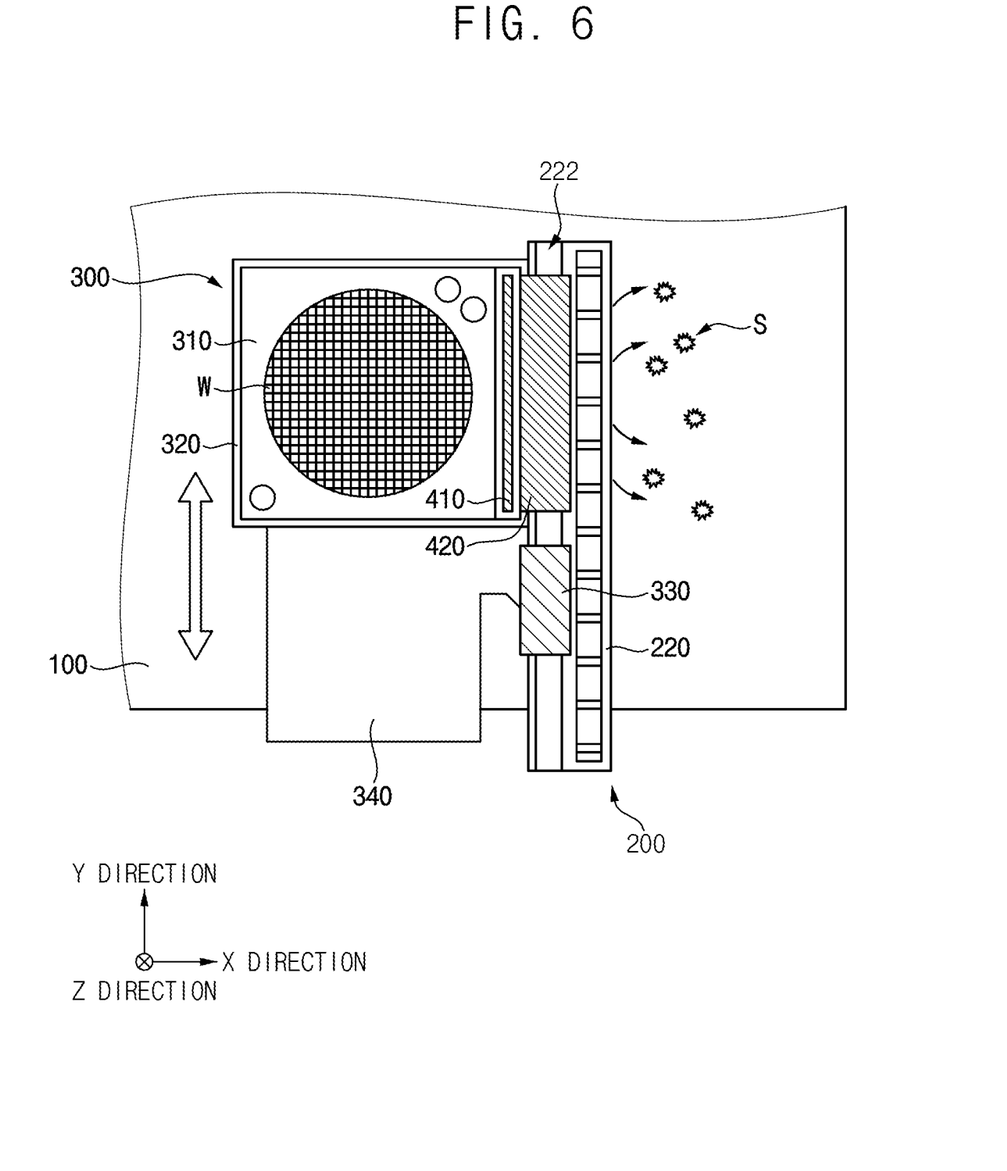
FIGS. 6 to 8 are views illustrating processes in which the positioning device in FIG. 1 moves in a first horizontal direction or a second horizontal direction.
Figure 7:
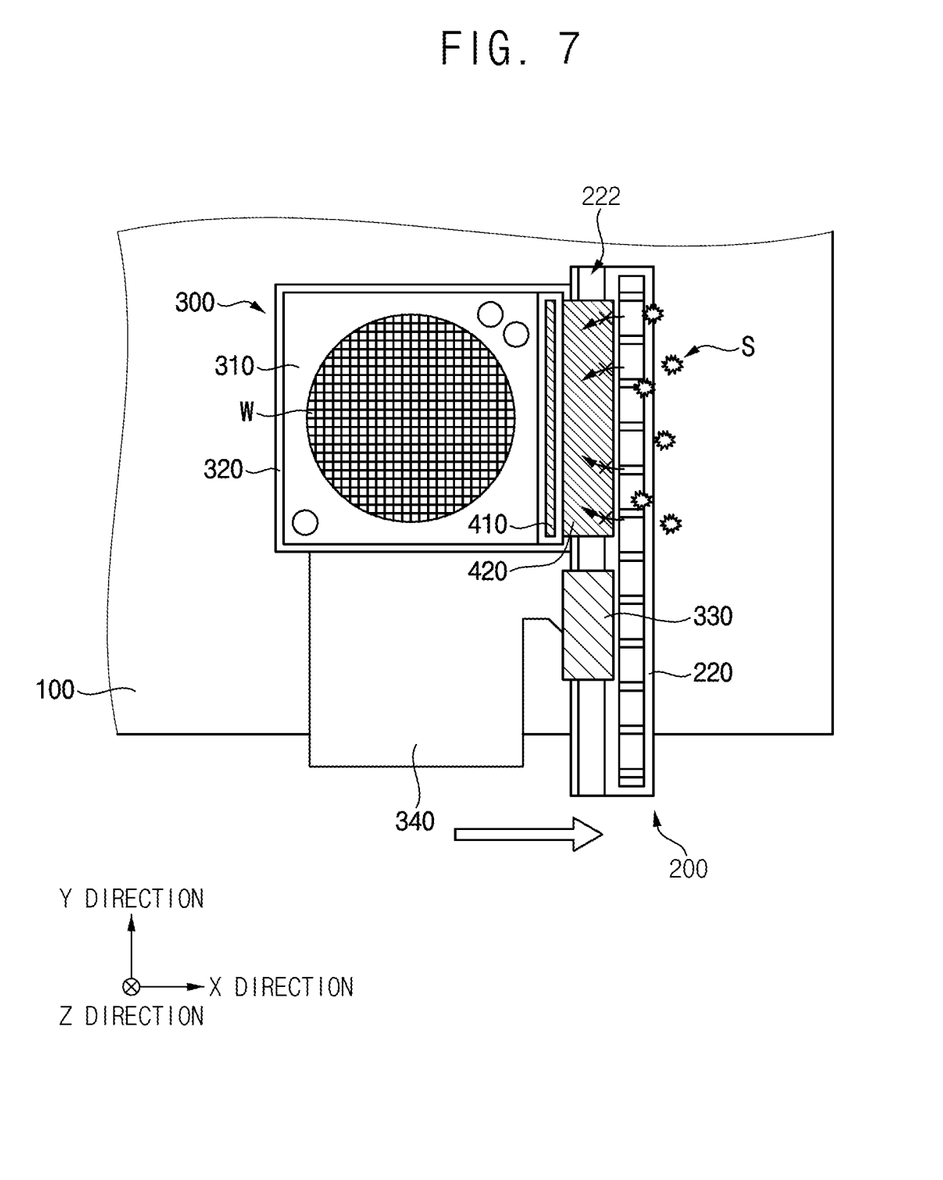
Figure 8:
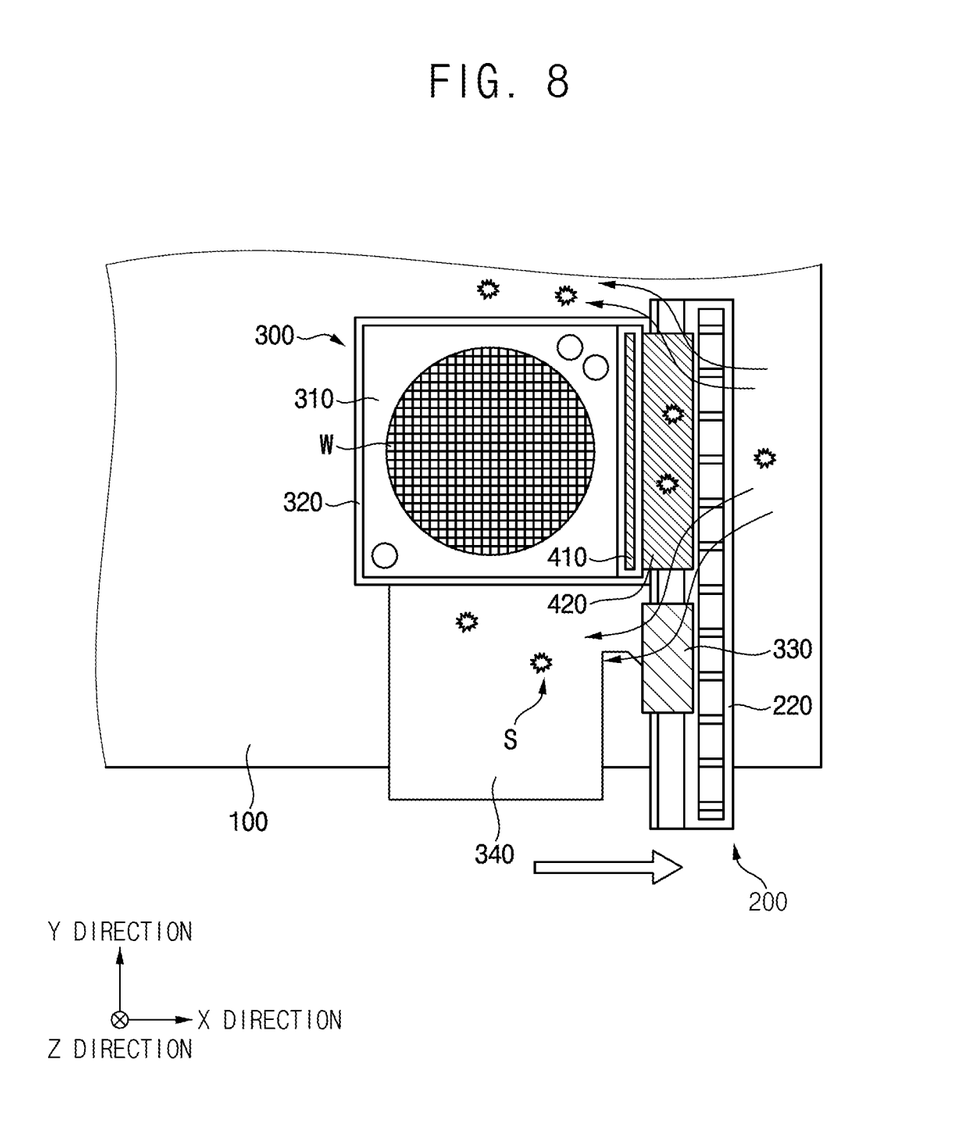

FIG. 1 is a view illustrating a substrate processing apparatus in accordance with example embodiments. FIG. 2 is a view illustrating a positioning device and a guiding device that are movable on a table. FIG. 3 is a plan view illustrating the positioning device and the guiding device in FIG. 2. FIG. 4 is cross-sectional views taken along the line A-A' in FIG. 3. FIG. 5 is cross-sectional views taken along the line B-B' in FIG. 3. FIGS. 6 to 8 are views illustrating processes in which the positioning device in FIG. 1 moves in a first horizontal direction or a second horizontal direction.

Referring to FIGS. 1 to 8, a substrate processing apparatus 10 may include a chamber 20 providing a space where an exposure process is performed on the semiconductor substrate W, a table 100 provided in the chamber 20, a guiding device 200 that is horizontally movable on or along the table 100, a positioning device 300 configured to transport the semiconductor substrate W, and a blocking member 400 configured to block an inflow of foreign substances onto the semiconductor substrate W. The substrate processing apparatus 10 may further include a power source configured to supply power, and first and second cables 500 and 510 configured to respectively transmit the power to the guiding device 200 and the positioning device 300.

In example embodiments, the substrate processing apparatus 10 may be used for a track system and an exposure system. The track system may form a photoresist layer and a photoresist pattern from the photoresist layer. The exposure system may irradiate light onto the photoresist layer to form a photoresist pattern area. The substrate processing apparatus 10 may be referred to an apparatus that performs a lithography process of drawing a circuit using the light on the semiconductor substrate. The substrate processing apparatus 10 may not be necessarily limited to an exposure device, and may be used as, for example, an etching device, a deposition device, a cleaning device, etc.

The exposure system may perform the exposure process. The exposure system may irradiate the light onto the photoresist layer that is formed on the substrate to form the photoresist pattern area for forming the photoresist pattern. The exposure system may align a mask on the semiconductor substrate, and may irradiate the light onto the mask to form the photoresist pattern area. For example, the photoresist layer may include a photosensitive material that reacts to extreme ultraviolet (EUV) light.

The track system may form the photoresist layer on the semiconductor substrate W such as a semiconductor wafer. The track system may form the photoresist pattern from the photoresist layer that is provided on the semiconductor substrate. For example, the semiconductor substrate may include a silicon wafer that has features having irregular surface topography formed thereon.

In example embodiments, the substrate processing apparatus 10 may further include an extreme ultraviolet light source device 30, and a mirror system 40. The mirror system 40 may include a contrasting mirror system and a projection mirror system.

The extreme ultraviolet light source device 30 may generate extreme ultraviolet light (EUVL). For example, the extreme ultraviolet light source device 30 may generate the extreme ultraviolet light through plasma, for example, light that has a wavelength of about 13.5 nm.

The mirror system 40 may include a plurality of contrast mirrors, and a plurality of projection mirrors. For example, the contrast mirrors may condense the extreme ultraviolet light to reduce loss of the extreme ultraviolet light that is lost to outside a mirrored irradiation path. The mirror system 40 may receive a reflected extreme ultraviolet light, and may transmit the reflected extreme ultraviolet light to the semiconductor substrate W.

In example embodiments, the table 100 may be provided in the chamber 20. The chamber 20 may provide an enclosed space that the exposure process is performed on the semiconductor substrate W therein.

The chamber 20 may include a reflective optical device that forms the photoresist pattern region through the extreme ultraviolet light having a high absorption rate. The reflective optical device may radiate the light to the positioning device 300 that is provided on the table 100. The reflective optical device may generate the light by a laser produced plasma (LPP) method using a laser irradiation method. The light may be reflected by a reflective mirror to perform the exposure process on the semiconductor substrate W that is disposed on the positioning device 300.

In example embodiments, the guiding device 200 may move together with the positioning device 300 on which the semiconductor substrate W is disposed. The guiding device 200 may include a first horizontal driving body 210 that moves in a first horizontal direction (X direction), and a guide rail 220 that extends in a second horizontal direction (Y direction).

In this specification, a direction in which the guiding device 200 moves along an outer surface or edge of the table 100 may be referred to as a first horizontal direction (X direction), a direction perpendicular to the first horizontal direction (X direction) may be referred to as a second horizontal direction (Y direction), and a direction perpendicular to the first horizontal direction and the second horizontal direction may be referred to as a vertical direction (Z direction).

A plurality of the guiding devices 200a and 200b may be provided on one table 100. The plurality of guiding devices 200a and 200b may move together with a plurality of the positioning devices 300a and 300b. For example, the number of guiding devices 200a and 200b may be two. The one guiding device 200a may move on one side of the table 100, and the other guiding device 200b may move on the other side (e.g., opposite side) of the table 100. The one guiding device 200a may move together with the positioning device 300a that performs the exposure process, and the other guiding device 200b may move together with the positioning device 300b that performs a measurement process.

The first horizontal driving body 210 may move along the outer surface or side surface or edge of the table 100. The first horizontal driving body 210 may transport the guide rail 220 in the first horizontal direction (X direction). The first horizontal driving body 210 may transport the guide rail 220 in the same direction as a moving direction of the positioning device 300. A movement speed of the first horizontal driving body 210 in the first horizontal direction (X direction) and a movement speed of the positioning device 300 in the first horizontal direction (X direction) may be the same.

The first horizontal driving body 210 may receive the power from the power source. The first horizontal driving body 210 may be electrically connected to the first cable 500 and receive the power through the first cable 500. The first horizontal driving body 210 may receive a movement command signal through the first cable 500. For example, the first cable 500 may include a flat cable that supplies the power without interfering with a movement of the first horizontal driving body 210.

The guide rail 220 may extend in the second horizontal direction (Y direction) perpendicular to the first horizontal direction (X direction). The guide rail 220 may extend on the table 100. The guide rail 220 may be on or combined with the first horizontal driving body 210, and the guide rail 220 may move in the first horizontal direction (X direction) on the table 100 through the first horizontal driving body 210.

The guide rail 220 may have a trench 222 that limits the movement of the positioning device 300. The trench 222 of the guide rail 220 may limit a movement of a slider 330 of the positioning device 300. The trench 222 of the guide rail 220 may limit the movement of the slider 330 of the positioning device 300 in the first horizontal direction (X direction), and may limit the movement of the slider 330 within a predetermined movement route.

Inner surfaces of the trench 222 may be spaced apart from outer surfaces of the slider 330 of the positioning device 300 to provide the movement route that the slider 330 moves therein. The guide rail 220 may be connected to or fixed to the first horizontal driving body 210 to prevent the positioning device 300 from rotating about a vertical axis (Z direction).

In example embodiments, the positioning device 300 may include a substrate stage 310 on which the semiconductor substrate W is arranged, a second horizontal driving body 320 that transports the substrate stage 310 on the table 100, and the slider 330 that slidably moves in the second horizontal direction (Y direction) in the trench 222 of the guide rail 220. The blocking member 400 that blocks the foreign substances S may be arranged on the positioning device 300. The positioning device 300 may further include a fastening member that fixes the blocking member 400 thereto.

A plurality of the positioning devices 300 may be provided on the one table 100. For example, the number of positioning devices 300 may be two. The one positioning device 300 may perform the exposure process on the semiconductor substrate W, and the other positioning device 300 may perform the measurement process.

As illustrated in FIG. 6, the second horizontal driving body 320 may transport the substrate stage 310 on the table 100. The second horizontal driving body 320 may transport the substrate stage 310 in the first horizontal direction (X direction) and the second horizontal direction (Y direction). The second horizontal driving body 320 may move along the guide rail 220 of the guiding device 200.

The second horizontal driving body 320 may transport the substrate stage 310 in the first horizontal direction (X direction) at the same speed as the movement speed of the first horizontal driving body 210. A movement speed of the second horizontal driving body 320 in the first horizontal direction (X direction) and a movement speed of the guide rail 220 of the first horizontal driving body 210 may be the same.

The second horizontal driving body 320 may transport the substrate stage 310 on the table 100 through magnetic levitation technology. The second horizontal driving body 320 may transport the substrate stage 310 through attraction and repulsive force of magnetic field. The magnetic field may be generated between the table 100 and the second horizontal driving body 320.

The slider 330 may slidably move within the trench 222 of the guide rail 220. The slider 330 may move in the second horizontal direction (Y direction) according to a moving direction of the second horizontal driving body 320. The slider 330 may be combined with and fixed to the substrate stage 310 and the second horizontal driving body 320 through a connecting member 340. The slider 330 may move in the second horizontal direction (Y direction) by receiving power of the second horizontal driving body 320 through the connecting member 340.

The outer surface of the slider 330 may be provided to be spaced apart from the inner surface of the trench 222 such that the slider 330 may move along the movement route. Movement of the slider 330 in the first horizontal direction (X direction) may be restricted by the trench 222. Since the movement of the slider 330 is restricted by the trench 222 and the slider 330 may be connected to or fixed to the substrate stage 310 through the connecting member 340, rotation of the substrate stage 310 in the vertical axis (Z direction) may be restricted by the slider 330. When the substrate stage 310 rotates, the slider 330 may collide with the inner surface of the trench 222 to restrict the rotation of the substrate stage 310.

A sliding blocking plate 334 may be provided on the slider 330. The sliding blocking plate 334 may extend along the guide rail 220 on the slider 330 in the second horizontal direction (Y direction). The sliding blocking plate 334 may move together with the slider 330. The sliding blocking plate 334 may block the inflow of the foreign substances S into the trench 222 of the guide rail 220. The sliding blocking plate 334 may prevent the release of the foreign substances S from the trench 222 of the guide rail 220. The sliding blocking plate 334 may physically block the foreign substances S.

The slider 330 may include a sliding supporter or sliding support 331 that is inserted into the trench 222 and moves in the second horizontal direction (Y direction), and a damper 332 that extends from or on an outer surface of the sliding supporter 331 in the second horizontal direction (Y direction) to absorb impact with the trench 222.

While the second horizontal driving body 320 moves, the damper 332 may collide with the inner surface of the trench 222. The damper 332 may alleviate the impact that is applied to the slider 330 while contacting the trench 222. The damper 332 may reduce frictional force with the trench 222 such that the slider 330 fluidly moves within the trench 222. The damper 332 may be combined with and separated from the slider 330. In other words, the damper 332 may be detachably connected to the slider 330 or the sliding supporter 331. The damper 332 may be inserted into a coupling groove of the slider 330 or the sliding supporter 331 and fixed to the slider 330 or the sliding supporter 331. When the damper 332 is worn, the damper 332 may be separated from the coupling groove and may be replaced.

The damper 332 may include an elastic member that reduces the frictional force with the slider 330. For example, the elastic member may include cellulose. While the slider 330 moves inside the trench 222, the damper 332 may be worn. When the damper 332 is worn, the elastic member may generate the foreign substances S.

Due to a structure of the trench 222 that is capable of accommodating the slider 330, the foreign substances S may remain in the trench 222. The foreign substances may cause defects in the semiconductor substrate W during the exposure process. For example, the foreign substances may include a compound that has silicon (Si), carbon (C), oxygen (O), and the like.

The second horizontal driving body 320 may receive the power from the power source. The second horizontal driving body 320 may be electrically connected to the second cable 510 and receive the power through the second cable 510. The second horizontal driving body 320 may receive a movement command signal through the second cable 510. For example, the second cable 510 may include the flat cable that supplies the power without interfering with a movement of the second horizontal driving body 320.

In example embodiments, the blocking member 400 may block the foreign substances S from being introduced into the semiconductor substrate W on the substrate stage 310. The blocking member 400 may physically block foreign substances S to protect the semiconductor substrate W.

The blocking member 400 may be provided on the substrate stage 310 or the second horizontal driving body 320. The blocking member 400 may move in the moving direction of the second horizontal driving body 320. The blocking member 400 may be provided between the guide rail 220 and the substrate stage 310 to block the inflow of the foreign substances S from the guide rail 220. The blocking member 400 may extend along an outer surface or an edge of the substrate stage 310.

The blocking member 400 may include a vertical blocking plate 410 that extends in the vertical direction (Z direction), and a horizontal blocking plate 420 that extends in the first horizontal direction (X direction) and the second horizontal direction (Y direction). The blocking member 400 may block at least a portion of airflow that is generated during the movement of the positioning device 300 through the vertical blocking plate 410 and the horizontal blocking plate 420. The airflow may transport the foreign substances S.

The vertical blocking plate 410 and the horizontal blocking plate 420 may be combined with and separated from the substrate stage 310. The vertical blocking plate 410 and the horizontal blocking plate 420 may be mechanically fixed on the substrate stage 310 through the fastening member 350. For example, the fastening member 350 may include coupling members such as screws, nails, bolts, and the like. The vertical blocking plate 410 and the horizontal blocking plate 420 may be independently managed with the positioning device 300 according to the process. The vertical blocking plate 410 and the horizontal blocking plate 420 may be exchanged when durability is exhausted.

As illustrated in FIG. 7, the horizontal blocking plate 420 may extend in the first horizontal direction (X direction) to cover or vertically overlap at least a portion of the guide rail 220. The horizontal blocking plate 420 may extend in a first horizontal direction (X direction) to cover or vertically overlap the trench 222. The horizontal blocking plate 420 may be provided to be spaced apart from the trench 222 of the guide rail 220 in the vertical direction (Z direction). The horizontal blocking plate 420 may block at least a portion of the airflow that is generated while the slider 330 moves within the trench 222.

The horizontal blocking plate 420 may block the airflow into the trench 222. Since the horizontal blocking plate 420 blocks the airflow, the foreign substances S that remain in the trench 222 may be blocked from the airflow. The horizontal blocking plate 420 may prevent the foreign substances S from being discharged to an outside of the trench 222 due to the airflow. The foreign substances S may be prevented from being introduced into the semiconductor substrate W on the substrate stage 310. The horizontal blocking plate 420 may prevent the defects of the semiconductor substrate W.

The horizontal blocking plate 420 may block the foreign substances S from being introduced into the trench 222 while the positioning device 300 moves in the first horizontal direction (X direction) through the guiding device 200. Since the horizontal blocking plate 420 blocks the airflow into the trench 222, the foreign substances S may not flow into the trench 222, and the remaining foreign substances S inside the trench 222 may not be discharged to the outside.

The horizontal blocking plate 420 may have a third length L3 in the first horizontal direction (X direction). The horizontal blocking plate 420 may have a fourth length L4 in the second horizontal direction (Y direction). The horizontal blocking plate 420 may have a second thickness T2. The third length L3 may have enough length such that the horizontal blocking plate 420 covers or vertically overlaps all of an upper side opening of the trench 222. That is, the horizontal blocking plate 420 may cover or vertically overlap an entirety of the trench 222. For example, the third length L3 may be within a range of 50 mm to 200 mm. The fourth length L4 may be within a range of 300 mm to 600 mm. The second thickness T2 may be within a range of 0.1 mm to 2.5 mm.

As illustrated in FIG. 8, the vertical blocking plate 410 may extend in the vertical direction (Z direction) to block the substrate stage 310 from the guide rail 220. The vertical blocking plate 410 may be provided along with the horizontal blocking plate 420 on the positioning device 300. The vertical blocking plate 410 may block at least a portion of the airflow that is generated while the guiding device 200 transports the substrate stage 310 of the positioning device 300. The vertical blocking plate 410 may form a side wall or blocking wall for the substrate stage 310 and block the foreign substances S from reaching the substrate stage 310 and the semiconductor substrate W.

The vertical blocking plate 410 may block the airflow onto the substrate stage 310. Since the vertical blocking plate 410 blocks the airflow, the foreign substances S that remain on the direction in which the positioning device 300 moves may be blocked from the airflow. The vertical blocking plate 410 may block the foreign substances S that are discharged from the trench 222, and the foreign substances S may be prevented from being introduced into the semiconductor substrate W on the substrate stage 310. The vertical blocking plate 410 may prevent the defects of the semiconductor substrate W.

The vertical blocking plate 410 may have a first length or height L1 in the vertical direction (Z direction). The vertical blocking plate 410 may have a second length L2 in a second horizontal direction (Y direction). The vertical blocking plate 410 may have a first thickness T1. The first length L1 and the second length L2 may have enough length such that the vertical blocking plate 410 covers all of one side surface of the substrate stage 310. For example, the first length L1 may be within a range of 50 mm to 100 mm. The second length L2 may be within a range of 300 mm to 600 mm. The first thickness T1 may be within a range of 0.1 mm to 2.5 mm.

The vertical blocking plate 410 and the horizontal blocking plate 420 may include the same material. The vertical blocking plate 410 and the horizontal blocking plate 420 may include a less reactive metal material so as not to interfere with the exposure process. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

As described above, the vertical blocking plate 410 may block the foreign substances S included in the airflow that is generated while the positioning device 300 moves in the first horizontal direction (X direction). Since the horizontal blocking plate 420 is spaced apart and covers the guide rail 220, the horizontal blocking plate 420 may block the release of the foreign substances S that remains in the trench 222 of the guide rail 220, and the horizontal blocking plate 420 may block the foreign substances S from flowing into the guide rail 220.

Since the trench 222 of the guide rail 220 has a structure suitable for retaining the foreign substances S, a large amount of the foreign substances S may remain inside the trench 222. The horizontal blocking plate 420 may prevent the foreign substances S from being discharged from the trench 222. Since the horizontal blocking plate 420 blocks the airflow into the trench 222 of the guide rail 220, generation of the foreign substances S during the process may be reduced. Since the airflow of the foreign substances S into the semiconductor substrate W is blocked, defects occurring on the semiconductor substrate W may be reduced.

Also, since the vertical blocking plate 410 and the horizontal blocking plate 420 may be combined with and separated from the positioning device 300, cleaning and maintenance may be facilitated.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:
1. A substrate processing apparatus, comprising:
   a table in an exposure chamber that is configured to perform an exposure process on a semiconductor substrate;
   a guiding device including a first horizontal driving body slidably movable in a first horizontal direction on the table and a guide rail on the first horizontal driving body and having a trench extending in a second horizontal direction perpendicular to the first horizontal direction;
   a positioning device connected to the guiding device to be movable together with the guiding device, the positioning device including a slider, a second horizontal driving body and a substrate stage, the slider configured to slidably move in the second horizontal direction along the trench of the guide rail, the second horizontal driving body connected or fixed to the slider to be movable together with the slider, the substrate stage on the second horizontal driving body and configured to support the semiconductor substrate; and
   a blocking member between the guide rail and the substrate stage to block an inflow of foreign substances onto the substrate stage, the blocking member including a vertical blocking plate and a horizontal blocking plate, the vertical blocking plate extending in a vertical direction at one side of the substrate stage to cover a side wall of the substrate stage, the horizontal blocking plate extending in the second horizontal direction from the one side of the substrate stage to vertically overlap the trench of the guide rail.

2. The substrate processing apparatus of claim 1, wherein the second horizontal driving body carries the substrate stage on the table by magnetic levitation.

3. The substrate processing apparatus of claim 1, wherein the slider further includes a sliding support that is received in the trench and moves in the second horizontal direction, and a damper extending in the second horizontal direction on an outer surface of the sliding support to absorb impact with the trench.

4. The substrate processing apparatus of claim 1, further comprising:
   an extreme ultraviolet light source device configured to generate light comprising extreme ultraviolet light; and
   a mirror system configured to transfer the light that is generated from the extreme ultraviolet light source device onto the semiconductor substrate.

5. The substrate processing apparatus of claim 1, wherein the vertical blocking plate and the horizontal blocking plate are detachably connected to the substrate stage.

6. The substrate processing apparatus of claim 5, wherein the positioning device further includes a fastening member that fixes the vertical blocking plate and the horizontal blocking plate on the substrate stage.

7. The substrate processing apparatus of claim 1, wherein the vertical blocking plate has a first length in the vertical direction and a second length in the second horizontal direction,
the first length is within a range of 50 mm to 100 mm, and
the second length is within a range of 300 mm to 600 mm.

8. The substrate processing apparatus of claim 1, wherein the horizontal blocking plate has a third length in the first horizontal direction and a fourth length in the second horizontal direction,
the third length is within a range of 50 mm to 200 mm, and
the fourth length is within a range of 300 mm to 600 mm.

9. The substrate processing apparatus of claim 1, wherein the vertical blocking plate has a first thickness,
the horizontal blocking plate has a second thickness,
the first thickness is within a range of 0.1 mm to 2.5 mm, and
the second thickness is within a range of 0.1 mm to 2.5 mm.

10. The substrate processing apparatus of claim 1, wherein the vertical blocking plate and the horizontal blocking plate include at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr) and tin (Sn).

11. A substrate processing apparatus, comprising:
a table in an exposure chamber that is configured to perform an exposure process on a semiconductor substrate;
a guiding device including a first horizontal driving body slidably movable in a first horizontal direction along an outside edge of the table and a guide rail at one side of the first horizontal driving body and extending on the table in a second horizontal direction perpendicular to the first horizontal direction, the guide rail having a trench therein and extending in the second horizontal direction;
a positioning device including a slider, a second horizontal driving body and a substrate stage, the substrate stage configured to support the semiconductor substrate, the second horizontal driving body configured to transfer the substrate stage on the table, the slider fixed to the substrate stage to slidably move in the second horizontal direction within the trench and to limit rotation of the substrate stage; and
a blocking member between the guide rail and the substrate stage to block an inflow of foreign substances onto the substrate stage, the blocking member detachably connected to the substrate stage, the blocking member including a vertical blocking plate and a horizontal blocking plate, the vertical blocking plate extending in a vertical direction, the horizontal blocking plate extending in the first horizontal direction to vertically overlap at least a portion of the guide rail.

12. The substrate processing apparatus of claim 11, wherein the second horizontal driving body carries the substrate stage on the table through magnetic levitation technology.

13. The substrate processing apparatus of claim 11, wherein the slider further includes a sliding support that is received in the trench and moves in the second horizontal direction, and a damper extending in the second horizontal direction on an outer surface of the sliding support to absorb impact with the trench.

14. The substrate processing apparatus of claim 11, further comprising:
an extreme ultraviolet light source device configured to generate light comprising extreme ultraviolet light; and
a mirror system configured to transfer the light that is generated from the extreme ultraviolet light source device onto the semiconductor substrate.

15. The substrate processing apparatus of claim 11, further comprising a fastening member that fixes the vertical blocking plate and the horizontal blocking plate on the substrate stage.

16. The substrate processing apparatus of claim 11, wherein the vertical blocking plate has a first length in the vertical direction and a second length in the second horizontal direction,
the first length is within a range of 50 mm to 100 mm, and
the second length is within a range of 300 mm to 600 mm.

17. The substrate processing apparatus of claim 11, wherein the horizontal blocking plate has a third length in the first horizontal direction and a fourth length in the second horizontal direction,
the third length is within a range of 50 mm to 200 mm, and
the fourth length is within a range of 300 mm to 600 mm.

18. The substrate processing apparatus of claim 11, wherein the vertical blocking plate has a first thickness,
the horizontal blocking plate has a second thickness,
the first thickness is within a range of 0.1 mm to 2.5 mm, and
the second thickness is within a range of 0.1 mm to 2.5 mm.

19. The substrate processing apparatus of claim 11, wherein the vertical blocking plate and the horizontal blocking plate include at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

20. A substrate processing apparatus, comprising:
a table on which an exposure process is performed on a semiconductor substrate;
a guiding device including a first horizontal driving body and a guide rail, the first horizontal driving body slidably movable in a first horizontal direction along an edge of the table, the guide rail extending on the table in a second horizontal direction perpendicular to the first horizontal direction; and
a positioning device configured to transport the semiconductor substrate on the table,
wherein the positioning device includes,
a substrate stage on which the semiconductor substrate is configured to be mounted;
a second horizontal driving body configured to transport the substrate stage on the table using magnetic levitation;
a slider connected or fixed to the substrate stage to be slidable in the second horizontal direction on the guide rail and to limit rotation of the substrate stage; and
a blocking member configured to be connected to and disconnected from the substrate stage, the blocking member configured to block an inflow of foreign substances from the guide rail, the blocking member including a vertical blocking plate and a horizontal blocking plate, the vertical blocking plate extending in a vertical direction from the substrate stage, the horizontal blocking plate extending away from the substrate stage in the first horizontal direction to be spaced apart from an upper surface of the guide rail and to vertically overlap at least a portion of the guide rail.

* * * * *